United States Patent
Gao et al.

(10) Patent No.: US 11,543,484 B1
(45) Date of Patent: Jan. 3, 2023

(54) PHASE CORRECTION SYSTEMS AND METHODS OF MAGNETIC RESONANCE IMAGES

(71) Applicant: GE PRECISION HEALTHCARE LLC, Wauwatosa, WI (US)

(72) Inventors: Lei Gao, Beijing (CN); Hua Li, Sussex, WI (US); Ting Zhang, Beijing (CN); Yongchuan Lai, Beijing (CN)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 0 days.

(21) Appl. No.: 17/351,692

(22) Filed: Jun. 18, 2021

(51) Int. Cl.
*G01R 33/565* (2006.01)
*G01R 33/561* (2006.01)
*G01R 33/48* (2006.01)

(52) U.S. Cl.
CPC ... *G01R 33/56545* (2013.01); *G01R 33/4818* (2013.01); *G01R 33/5616* (2013.01)

(58) Field of Classification Search
CPC .......... G01R 33/56545; G01R 33/4818; G01R 33/5616
See application file for complete search history.

(56) References Cited

U.S. PATENT DOCUMENTS

| 5,621,321 | A | * | 4/1997 | Liu | G01R 33/56554 324/309 |
| 5,672,969 | A | | 9/1997 | Zhou et al. | |
| 2019/0101605 | A1 | * | 4/2019 | Hyun | G01R 33/5611 |
| 2020/0337591 | A1 | * | 10/2020 | Rotman | G01R 33/4818 |

OTHER PUBLICATIONS

Chen et al: "A robust multi-shot scan strategy for high-resolution diffusion weighted MRI enabled by multiplexed sensitivity-encoding (MUSE)", Neuroimage, Academic Press, Orlando, FL, US, vol. 72, Jan. 28, 2013 (Jan. 28, 2013), pp. 41-47, XP028995626, ISSN: 1053-8119, DOI: 10.1016/J.NEUROIMAGE.2013.01.038.

(Continued)

*Primary Examiner* — Susan S Lee
(74) *Attorney, Agent, or Firm* — Armstrong Teasdale LLP (57) ABSTRACT

A magnetic resonance (MR) imaging method of correcting phase errors is provided. The method includes applying, by an MR system, a pulse sequence to acquire the precorrection MR image. The method also includes acquiring, by the MR system, reference k-space data having a field of view (FOV) in a phase-encoding direction that is twice or more greater than an FOV of the precorrection MR image in the phase-encoding direction, wherein the reference k-space data and MR signals of the precorrection MR image are acquired with the same type of pulse sequences. The method further includes splitting the reference k-space data into first k-space data and second k-space data, generating a phase error map based on the first k-space data and the second k-space data, generating a phase-corrected image of the precorrection MR image based on the phase error map, and outputting the phase-corrected image.

20 Claims, 7 Drawing Sheets

(56) References Cited

OTHER PUBLICATIONS

Lyu et al., "Robust SENSE reconstruction of simultaneous multislice EPI with low-rank enhanced coil sensitivity calibration and slice-dependent 2D Nyquist ghost correction", Magn Reson Med. Oct. 2018; 80(4):1376-1390. doi: 10.1002/mrm.27120. Epub Feb. 9, 2018. PMID: 29427405.

Liu et al., "Nyquist Artifact Correction for Multi-band and Multi-shot EPI Using Multiplexed Sensitivity Encoding (MUSE)—A Self-reference 2D Phase Correction Method", Proc. Intl. Soc. Mag. Reson. Med. 26 (2018), Accessed online at: http://indexsmart.mirasmart.com/ISMRM2018/PDFfiles/4121.html.

Xie et al., "Robust EPI Nyquist Ghost Removal by Incorporating Phase Error Correction With Sensitivity Encoding (PEC-SENSE)", Magnetic Resonance in Medicine, 79.2 (2018): 943-951, DOI: 10.1002/mrm.26710.

Xu et al. "Robust 2D Phase Correction for Echo Planar Imaging Under a Tight Field-of-View", Magnetic Resonance in Medicine 64.6 (2010): 1800-1813, DOI :10.1002/mrm.22577.

Wang et al., "Referenceless high order EPI calibration based on multiplexed SENSE", e-Poster, Proc. Intl. Soc. Mag. Reson. Med. 24 (2016), 2 pages.

\* cited by examiner

PHASE CORRECTION SYSTEMS AND METHODS OF MAGNETIC RESONANCE IMAGES

BACKGROUND

The field of the disclosure relates generally to systems and methods of phase correction, and more particularly, to systems and methods of phase correction in magnetic resonance (MR) images.

Magnetic resonance imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

Echo-planar imaging (EPI) acquisition is used to speed up the acquisition of MR signals. Known EPI acquisition is disadvantaged in some aspects and improvements are desired.

BRIEF DESCRIPTION

In one aspect, a magnetic resonance (MR) imaging method of correcting phase errors in a precorrection MR image of a subject is provided. The method includes applying, by an MR system, a pulse sequence to acquire the precorrection MR image. The method also includes acquiring, by the MR system, reference k-space data of the subject having a field of view (FOV) in a phase-encoding direction that is twice or more greater than an FOV of the precorrection MR image in the phase-encoding direction, wherein the reference k-space data and MR signals of the precorrection MR image are acquired with the same type of pulse sequences. The method further includes splitting the reference k-space data into first k-space data and second k-space data, generating a phase error map based on the first k-space data and the second k-space data, generating a phase-corrected image of the precorrection MR image based on the phase error map, and outputting the phase-corrected image.

In another aspect, a phase correction system of correcting phase errors in a precorrection MR image of a subject is provided. The system includes a phase correction computing device, the phase correction computing device including at least one processor in communication with at least one memory device. The at least one processor is programmed to instruct, an MR system, to acquire reference k-space data of the subject having an FOV in a phase-encoding direction that is twice or more greater than an FOV of the precorrection MR image in the phase-encoding direction, wherein the reference k-space data and MR signals of the precorrection MR image are acquired with the same type of pulse sequences. The at least one processor is also programmed to split the reference k-space data into first k-space data and second k-space data, generate a phase error map based on the first k-space data and the second k-space data, correcting phase errors in the precorrection MR image based on the phase error map, and output the phase-corrected image.

DETAILED DESCRIPTION

The disclosure includes systems and methods of reducing or correcting phase errors in magnetic resonance (MR) images of a subject. As used herein, a subject is a human, an animal, or a phantom. Reducing or correcting phase errors as used herein is reduction and/or removal of phase errors in MR images. A single shot echo planar imaging (EPI) with Cartesian sampling is described herein as an example only. The systems and methods disclosed herein may be applied to correct phase errors in images acquired by multi-shot EPI. Method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as B0 and extends in the longitudinal or z direction. In acquiring an MRI image, a magnetic field (referred to as an excitation field B1), which is in the x-y plane and near the Larmor frequency, is generated by a radiofrequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

Figure 1:
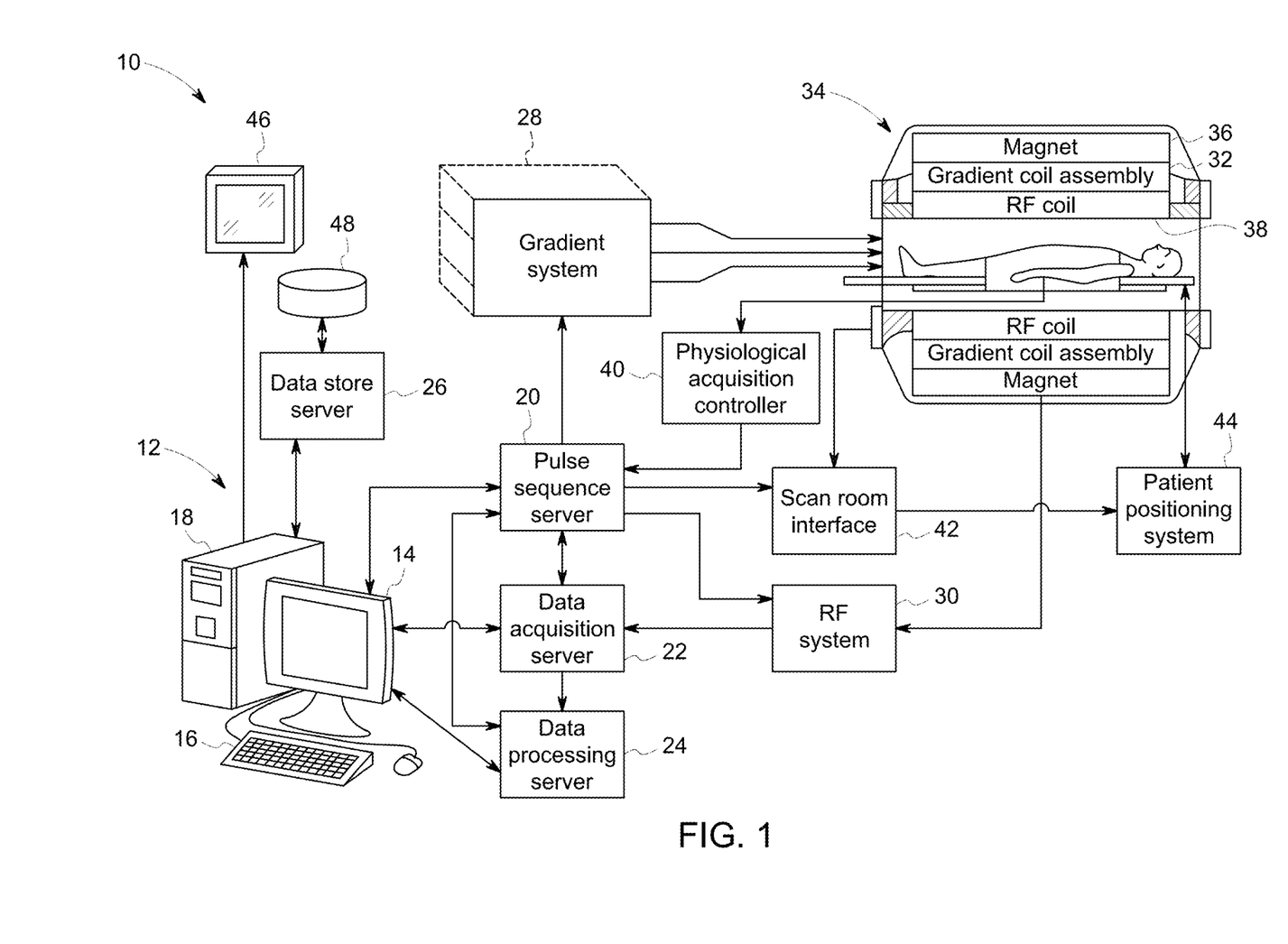
FIG. 1 is a schematic diagram of an exemplary magnetic resonance imaging (MRI) system.

FIG. 1 illustrates a schematic diagram of an exemplary MRI system 10. In the exemplary embodiment, the MRI system 10 includes a workstation 12 having a display 14 and a keyboard 16. The workstation 12 includes a processor 18, such as a commercially available programmable machine running a commercially available operating system. The workstation 12 provides an operator interface that allows scan prescriptions to be entered into the MRI system 10. The workstation 12 is coupled to a pulse sequence server 20, a data acquisition server 22, a data processing server 24, and a data store server 26. The workstation 12 and each server 20, 22, 24, and 26 communicate with each other.

In the exemplary embodiment, the pulse sequence server 20 responds to instructions downloaded from the workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. The RF coil 38 is shown as a whole body RF coil. The RF coil 38 may also be a local coil that may be placed in proximity to the anatomy to be imaged, or a coil array that includes a plurality of coils.

In the exemplary embodiment, gradient waveforms used to perform the prescribed scan are produced and applied to the gradient system 28, which excites gradient coils in the gradient coil assembly 32 to produce the magnetic field gradients $G_x$, $G_y$, and $G_z$ used for frequency encoding, phase encoding, and slice selection/encoding of MR signals. The gradient coil assembly 32 forms part of a magnet assembly 34 that also includes a polarizing magnet 36 and the RF coil 38.

In the exemplary embodiment, the RF system 30 includes an RF transmitter for producing RF pulses used in MR pulse sequences. The RF transmitter is responsive to the scan prescription and direction from the pulse sequence server 20 to produce RF pulses of a desired frequency, phase, and pulse amplitude waveform. The generated RF pulses may be applied to the RF coil 38 by the RF system 30. Responsive MR signals detected by the RF coil 38 are received by the RF system 30, amplified, demodulated, filtered, and digitized under direction of commands produced by the pulse sequence server 20. The RF coil 38 is described as a transmitter and receiver coil such that the RF coil 38 transmits RF pulses and detects MR signals. In one embodiment, the MRI system 10 may include a transmitter RF coil that transmits RF pulses and a separate receiver coil that detects MR signals. A transmission channel of the RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, the RF system 30 also includes one or more RF receiver channels. Each RF receiver channel includes an RF amplifier that amplifies the MR signal received by the RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M = \sqrt{I^2 + Q^2} \quad (1);$$

and the phase of the received MR signal may also be determined as in Eq. (2) below:

$$\varphi = \tan^{-1}\left(\frac{Q}{I}\right). \quad (2)$$

In the exemplary embodiment, the digitized MR signal samples produced by the RF system 30 are received by the data acquisition server 22. The data acquisition server 22 may operate in response to instructions downloaded from the workstation 12 to receive real-time MR data and provide buffer storage such that no data is lost by data overrun. In some scans, the data acquisition server 22 does little more than pass the acquired MR data to the data processing server 24. In scans that need information derived from acquired MR data to control further performance of the scan, however, the data acquisition server 22 is programmed to produce the needed information and convey it to the pulse sequence server 20. For example, during prescans, MR data is acquired and used to calibrate the pulse sequence performed by the pulse sequence server 20. Also, navigator signals may be acquired during a scan and used to adjust the operating parameters of the RF system 30 or the gradient system 28, or to control the view order in which k-space is sampled.

In the exemplary embodiment, the data processing server 24 receives MR data from the data acquisition server 22 and processes it in accordance with instructions downloaded from the workstation 12. Such processing may include, for example, Fourier transformation of raw k-space MR data to produce two or three-dimensional images, the application of filters to a reconstructed image, the generation of functional MR images, and the calculation of motion or flow images.

In the exemplary embodiment, images reconstructed by the data processing server 24 are conveyed back to, and stored at, the workstation 12. In some embodiments, real-time images are stored in a database memory cache (not shown in FIG. 1), from which they may be output to operator display 14 or a display 46 that is located near the magnet assembly 34 for use by attending physicians. Batch mode images or selected real time images may be stored in a host database on disc storage 48 or on a cloud. When such images have been reconstructed and transferred to storage, the data processing server 24 notifies the data store server 26. The workstation 12 may be used by an operator to archive the images, produce films, or send the images via a network to other facilities.

Systems and methods described herein are used to reduce phase errors of MR images. Phase errors, especially those of orders higher than one, are estimated using a reference scan that has a field of view (FOV) in the phase-encoding direction twice or more greater than the FOV of the MR images in the phase-encoding direction. The ghost artifacts caused by phase errors are greatly reduced with the systems and methods described herein, while the penalty of increase in scan time from the reference scan is negligible.

Compared to other imaging modalities, MRI is unique in that an MRI signal is represented by a complex number, rather than a scalar or a real number. The image value for each image pixel, therefore, includes a magnitude and a phase. Complex MR images may be reconstructed based on I and Q quadrature MR signals, using processes such as Fourier transform.

Figure 2A:
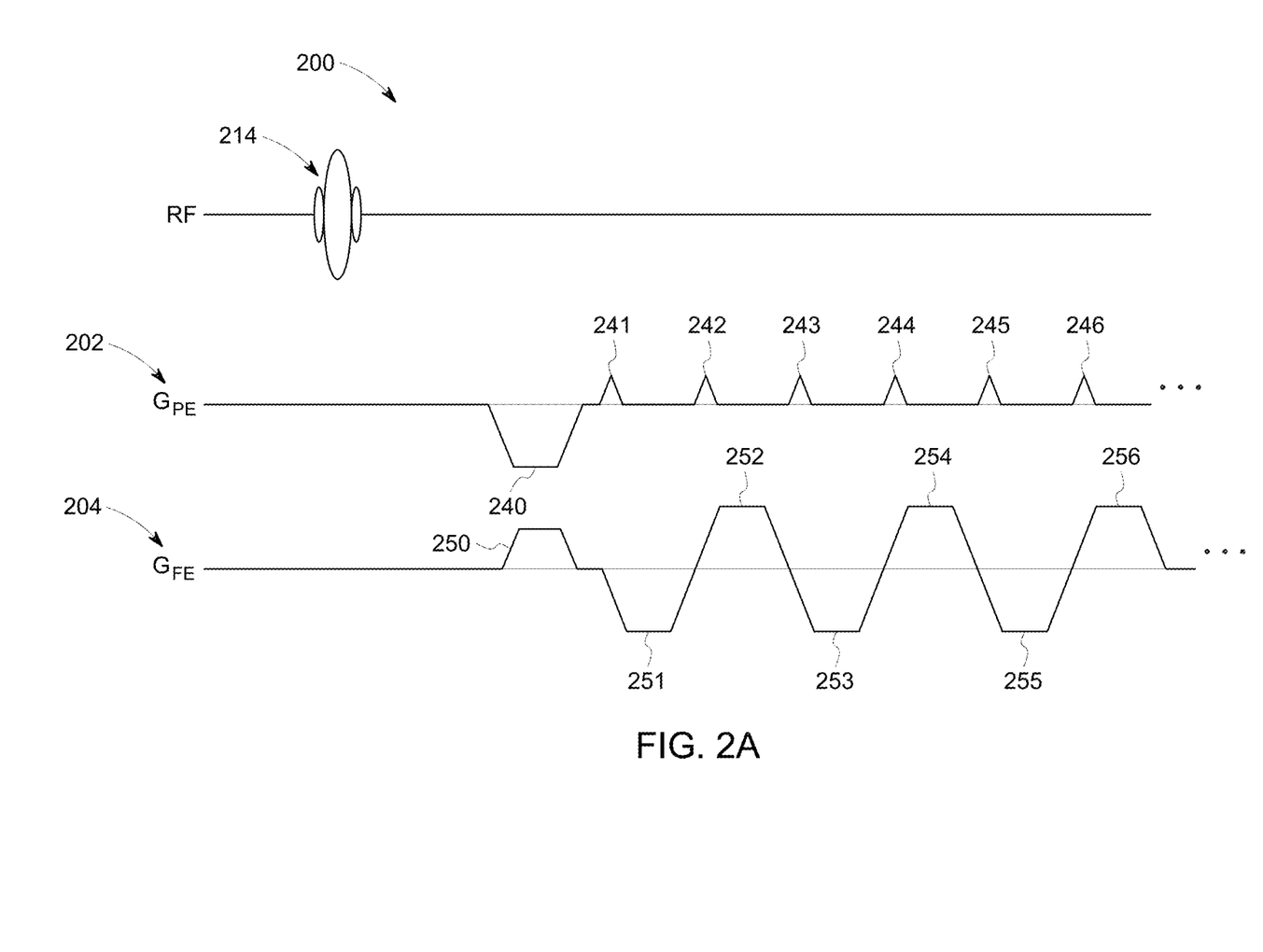
FIG. 2A is a schematic diagram of an echo-planar imaging (EPI) pulse sequence.
Figure 2B:
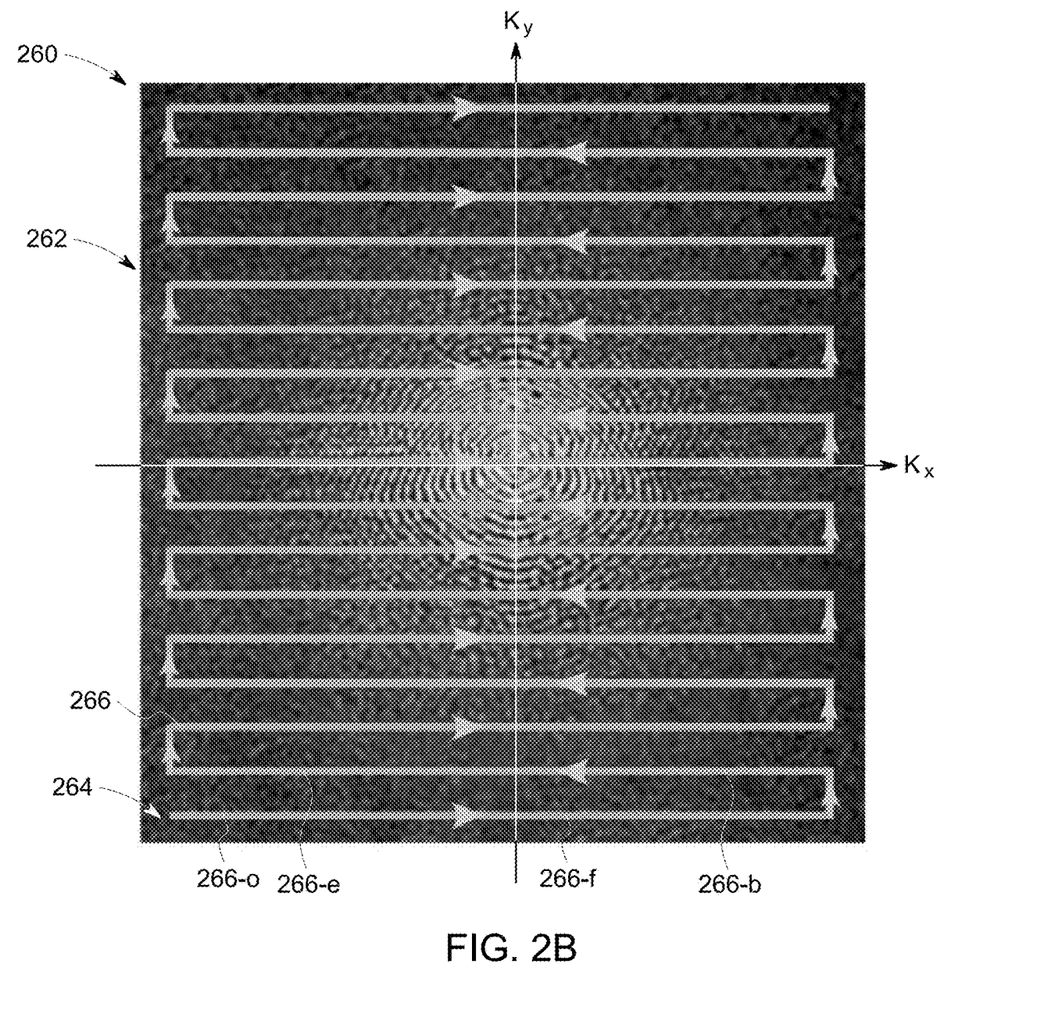
FIG. 2B is a schematic diagram of the k-space trajectory of the pulse sequence shown in FIG. 2A.

FIGS. 2A and 2B show an EPI sequence 200 and its corresponding k-space trajectory 260. The k-space includes the kx axis and the ky axis, where kx and ky represent spatial frequencies, and correspond to the read-out or frequency-encoding (FE) direction and the phase-encoding (PE) direction, respectively. The k-space trajectory 260 is overlaid on k-space raw data 262 displayed as an image. In MR, a pulse sequence is a sequence of RF pulses, gradient pulses, and data acquisition applied by the MRI system 10 in acquiring MR signals. EPI is an ultrafast MRI technique wherein an entire image can be formed with MR signals generated by a single RF excitation. EPI may be referred to an acquisition mode of the k-space. The pulse sequence 200 includes an RF pulse 214, a train of PE gradients $G_{PE}$ 202 and FE gradients $G_{FE}$ 204. The train of PE gradients 202 may start with a large gradient 240. The train of FE gradient 204 may start with a large gradient 250. As a result, the acquisition point in the k-space starts at the periphery 264 of the k-space (FIG. 2B). That is, the k-space trajectory or scanning trajectory 260 of the pulse sequence 200 starts at the periphery corner 264. After the large PE gradient 240, a plurality of small PE gradient "blips" are each placed at the FE gradient reversal from positive to negative or from negative to positive. For example, blip 241 is placed at start of negative FE gradient 251, blip 242 is placed at the reversal of negative readout gradient 251 to positive readout gradient 252, blip 243 is placed at the reversal of positive readout gradient 252 to negative readout gradient 253, and so on. The blips are of constant size and each add further phase encoding to the previous blips. The number of FE gradients 251-256 and blips 241-246 depends on the matrix size of the MR images in the phase-encoding direction, which may be 64, 128, 256, or other numbers.

With the EPI pulse sequence 200, data acquired by an EPI pulse sequence include a train of echoes, one echo generated for each kx line 266 of k-space following a zig-zag trajectory through the k-space. Each kx line 266 is scanned by a FE gradient 251-256. The PE gradient blips 241-246 moves the trajectory 260 from one kx line 266 to the next kx line 266. Two adjacent echoes 266-o, 266-e are acquired in opposite directions. The echoes may be referred to as odd echoes 266-o and even echoes 266-e, depending the order of the echoes in the train of echoes. For example, the first, third, and fifth echoes are referred to as odd echoes 266-o, and the second, fourth, and sixth echoes are referred to as even echoes 266-e. The echoes may also be referred to as forward and backward echoes 266-f, 266-b, depending on the scanning direction in the k-space. If the forward and backward echoes 266-f, 266-b are not perfect mirror images of each other, artifacts are introduced into the image at reconstruction. For example, a delay of the start of the first echo will be propagated into all later echoes, resulting in timing differences between the peaks of odd- and even-numbered echoes. When the Fourier transform is performed, this phase error would result in signal intensity displaced in the phase-encoding direction halfway across the image, which is called the Nyquist ghost. If there are N pixels across the field of view (FOV), this aliased ghost appears shifted N/2 pixels relative to the main image positioned at the correct location. Nyquist ghosts may result from many possible causes, such as eddy currents induced in coils and the magnet housing in response to rapidly changing gradients pulses, poor RF shield, gradient coil heating, and gradient system delays. Ghost artifacts are more severe in oblique imaging, where the slice-selection or second phase-encoding direction is not along an orthogonal axis, than ghost artifacts in orthogonal imaging, where the slice-selection or second phase-encoding direction is along one of the orthogonal axes. Ghost artifacts deteriorate image quality of the MR images and compromise diagnosis using MR images.

FIGS. 2A and 2B show a single-shot EPI sequence, where an entire 2D slice is collected following a single RF excitation pulse 214. EPI sequences may be multi-shot EPI sequences, where the 2D plane is collected with multiple RF excitation pulse 214, with each RF excitation pulse 214 following acquisition of a segment of the 2D plane.

Figure 3:
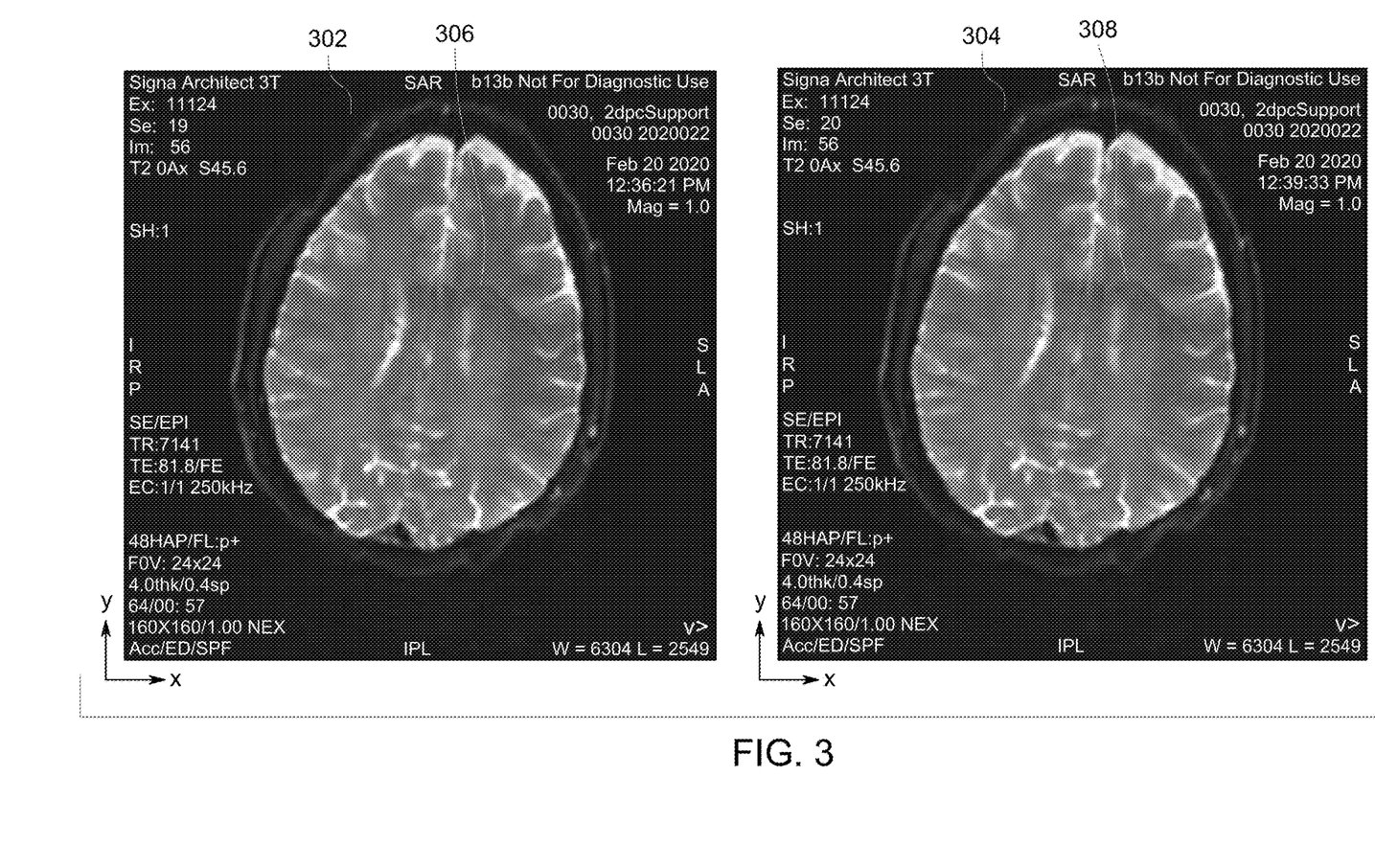
FIG. 3 is a comparison of EPI images without phase correction and with a known method of phase correction.

FIG. 3 shows images 302, 304 acquired with the EPI sequence 200. The images 302, 304 are based on the same k-space data 262. For the image 304, a known phase correction method is applied, where linear phase errors were corrected, while the image 302 does not have any phase correction. Both images 302, 304 have respective ghost artifacts 306, 308, although the ghost artifacts 308 of the image 304 are less than the ghost artifacts 306. In linear phase correction, constant and linear portions of the phase errors are estimated and removed from the phases of the k-space data of the MR image. As shown in FIG. 3, linear phase correction, however, does not remove majority of the phase errors. A significant portion of phase errors are at higher orders than constant and linear portions. In other words, if the phase errors are expressed as a two-dimensional (2D) polynomial function as:

$$\phi_{error}(x,y) = \Sigma a_{ij} x^i y^j, \quad (3)$$

the higher order terms $a_{ij}$ ($i+j \geq 2$), such as for $x^2$, $x^3$, $xy$, $x^2y$, $xy^2$, $y^3$ of the phase error $\phi_{error}$ are not small compared to the constant $a_{00}$ and linear portion $a_{01}$ for x and $a_{01}$ for y, and cannot be discarded. The degree of the polynomial function shown in Eqn. (3) is the sum of i and j.

Figure 4A:
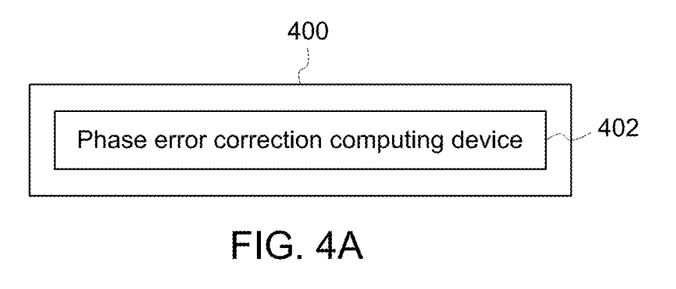
FIG. 4A is an exemplary phase correction system.

FIG. 4A is a schematic diagram of an exemplary phase correction system 400. In the exemplary embodiment, the system 400 includes a phase correction computing device 402 configured to correct phase error of MR images. The phase correction computing device 402 may be included in the workstation 12 of the MRI system 10, or may be included in a separate computing device that is in communication with the workstation 12, through wired or wireless communication. In some embodiments, the phase correction computing device 402 is a separate computing device from the workstation 12 and receives MR images acquired by the workstation 12 through a portable storage device, such as a flash drive or a thumb drive.

Figure 4B:
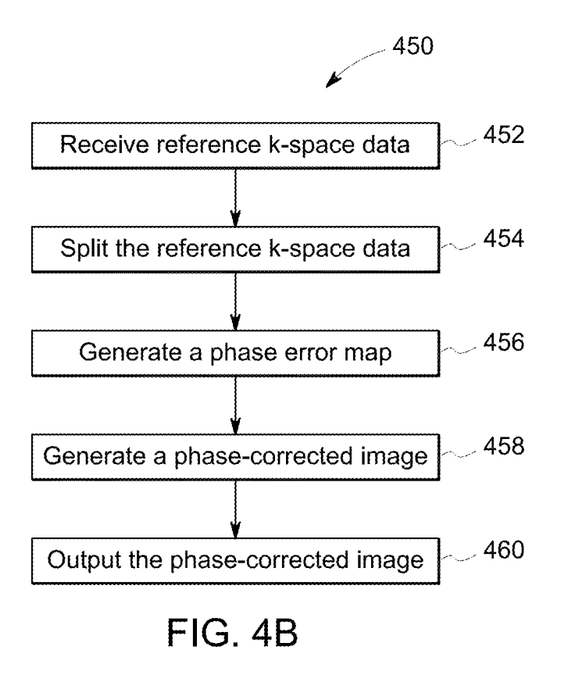
FIG. 4B is a flow chart of an exemplary method of phase correction.

FIG. 4B is a flow chart of an exemplary phase correction method 450 of correcting phase errors of a precorrection MR image. A precorrection image as used herein is an MR image before application of phase correction using the systems and methods described herein. The method 450 may be implemented on the phase correction computing device 402. In the exemplary embodiment, the method includes receiving 452 reference k-space data of the subject having a field of view (FOV) in a phase-encoding direction that is twice or more greater than the FOV of the precorrection MR image. FOV is the dimension of an MR image. For example, the images 302, 304 both have an FOV of 24×24 in centimeters (cm), where the first dimension of 24 cm is in the FE or x direction and the second dimension of 24 cm is in the PE or y direction (FIG. 3). Receiving 452 reference k-space data may include acquiring by the MR system 10 the reference k-space data. The reference scan used to acquire the reference k-space data may be performed before or after acquisition of precorrection MR images. For example, if a number of EPI images of an FOV and matrix sizes are prescribed to be acquired with the pulse sequence 200, a reference scan using the pulse sequence 200 is performed before or after the acquisition of the regular EPI images. The reference k-space data has an FOV ($FOV_{y, ref}$) in the y or phase-encoding direction twice or more greater than the FOV ($FOV_{y, reg}$) in the phase-encoding direction of the images acquired with the regular EPI scan or the precorrection MR images. i.e., $FOV_{y, ref} \geq 2 * FOV_{y, reg}$. The FOV in the x or read-out direction is the same between the reference scan and the regular scan.

In the exemplary embodiment, the method 450 further includes splitting 454 the reference k-space data into first k-space data and second k-space data. The method 450 also includes generating 456 a phase error map based on the first k-space data and the second k-space data. Further, the method 450 includes generating 458 a phase-corrected image of the precorrection MR image based on the phase error map. To correct phases of an image, the phase error is subtracted from the phases of the image in the image domain or in the k-space domain. For example, if parallel imaging is not used, i.e., an image is reconstructed based on k-space data from one coil, in the image domain, each data point of a complex number in the image in the image domain is multiplied by $e^{i \, phaseError}$ of a phase error at the corresponding pixel location in the phase error map, or in the k-space domain, each data point of a complex number in the k-space data of the image is multiplied by $e^{-i \, phaseError}$ of the phase error at the corresponding pixel location in the phase error map. Alternatively, when parallel imaging is used, where an image is reconstructed based on k-space data acquired by more than one coil, the phase error map is applied to the sensitivity map of each coil. In parallel imaging, before being combined to form one image, the images from the coils are weighted by the coils' corresponding sensitivity maps S1 in the image domain. To correct phase error using the phase error map, each data point of a sensitivity map S1 in the image domain is multiplied by $e^{-i\ phaseerror}$ at the corresponding pixel location in the phase error map. The method 450 also includes outputting 460 the phase-corrected image.

In one example, the reference k-space data is split into odd echo k-space data and even echo k-space data. Because the odd echoes 266-o and even echoes 266-e are acquired in opposite directions from each other, either odd echo k-space data or even k-space data are flipped such that the odd and even k-space data are in the same direction in the k-space. Further, because odd and even k-space data are acquired along different kx line in the k-space (see FIG. 2B), a pixel shift phase compensation is applied to odd k-space data, even k-space data, or both such that odd and even k-space data correspond to the same kx lines in the k-space. After these adjustments, the odd and even k-space data are k-space data of the same k-space locations as if the same kx lines had been acquired twice.

In the depicted embodiment, a phase difference map is derived by subtracting the phases of the odd k-space data from the phases of the even k-space data, or subtracting the phases of the even k-space data from the phases of the odd k-space data. In some embodiments, the phase difference map is used as the phase error map. In one example, a phase error map is the phase difference map applied with a low-pass filter, to remove or reduce the artifacts at the edge of the phase difference map. For example, an exemplary low pass filter is a Hanning window and the phase difference map is convoluted with the Hanning window to derive the phase error map. In some embodiments, a polynomial fitting may be applied to the phase difference map. For example, the phase difference map is fitted with a two-dimensional polynomial function, which is like the function in Eqn. (3), except that the phase error $\varnothing_{error}$ is a function of x and y. The fitted phase map is used as the phase difference map. An exemplary degree of the polynomial function is five. Empirical testing and simulation of eddy current generated by gradient coils show that phase errors of order higher than five is small such that the ghost artifacts caused by phase errors higher than five are not discernible. The degree of the polynomial function may be in other numbers, largely depending on the eddy current produced by the gradient coils.

In one example, the phase difference map is a fitted with a two-dimensional polynomial function having a constant term and a linear term, i.e., the polynomial function having a degree of one. The fitted phase map therefore includes constant and linear terms of phase errors. The linear phase errors may be used to adjust the read-out and/or phase-encoding gradients in the EPI pulse sequence 200 by increasing, if the linear phase error b1 is negative, or decreasing, if the linear phase error b1 is positive, amplitudes of the read-out and/or phase-encoding gradients, respectively, in an amount proportional to the linear phase errors. In some embodiments, constant and linear phase errors in the read-out direction may be estimated by scanning a kx line multiple times without phase-encoding gradients or adjusted phase-encoding gradients, and the phase errors in the phase-encoding direction are derived by subtracting the estimated phase errors in the read-out direction from the phase difference map. In one embodiment, the phase-encoding gradients are adjusted based on the linear phase errors in the phase-encoding direction derived above, while the read-out gradients remain unadjusted. Alternatively, the derived linear phase errors in the read-out and the phase-encoding directions are used to adjust the read-out and the phase-encoding gradients in the EPI pulse sequence 200, respectively. Images acquired by the EPI pulse sequence 200 of adjusted read-out and/or phase-encoding gradients may be used to increase the accuracy of the phase error map, especially high-order phase errors, because the linear phase errors in the images acquired with adjusted gradients are reduced. The phase error map may be an adjusted phase error map that is the phase difference map subtracted by a linear phase error map, which includes the constant and linear phase error terms. Generating 458 a phase-corrected image may include using the adjusted phase error map to correct the images acquired by the adjusted EPI pulse sequence 200.

In some embodiments, an acceleration factor of the parallel imaging is doubled by using the even echo data and odd echo data as two separate channels. As described above, in parallel imaging, MR signals of one image are acquired by a plurality of RF coils. The speed of acquisition is increased by each coil partially sampling the k-space. To derive the MR image based on the MR signals acquired by the multiple coils, coil sensitivity maps are generated, partial FOV images from each coil are reconstructed, and the partial FOV images are merged into the final image using weightings from the coil sensitivity maps. In the depicted example, for each coil, the acquired MR data are split into odd echo data and even echo data. Two separate images $I_{odd}$ and $I_{even}$ are reconstructed based on the odd echo data and the even echo data, respectively. The two images $I_{odd}$ and $I_{even}$ are combined into a combined image $I_{comb}$. For the coil sensitivity map S of the coil, a replicated sensitivity map $S_r$ is generated first as a replication of the coil sensitivity map S. A pixel shift phase compensation and the phase error map derived from the reference scan are applied to the replicated sensitivity map $S_r$ to derive an adjusted replicated sensitivity map $S_r$. Afterwards, the two coil sensitivity maps S and $S_r$ are combined into a combined coil sensitivity map $S_{comb}$ of the coil. A final image is generated using the combined image $I_{comb}$ and the combined coil sensitivity map $S_{comb}$. As a result, the acceleration factor in the phase-encoding direction is doubled.

Figure 5:
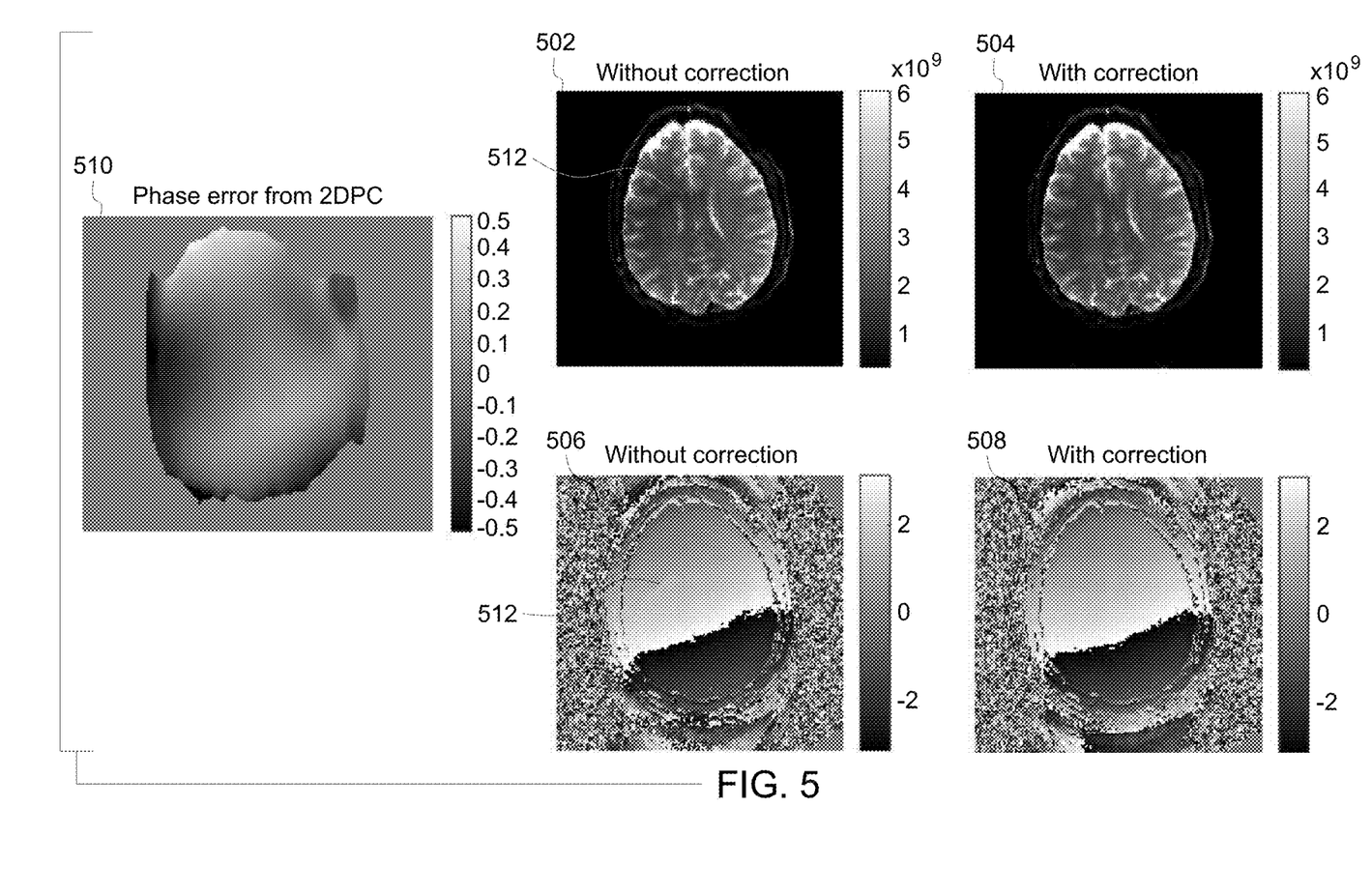
FIG. 5 shows EPI images without phase correction and with the phase correction systems and methods shown in FIGS. 4A and 4B, their phase maps, and an exemplary phase error map.

FIG. 5 shows an EPI image 502 without phase correction and an EPI image 504 with phase correction using systems and methods disclosed herein, their phase maps 506, 508, and an exemplary phase error map 510 for the EPI image 502. Both images 502, 504 are reconstructed from the same MR signals. Comparing the image 504 with phase correction to the image 502 without phase correction, the ghost artifacts 512 are largely reduced in the image 504 to an indiscernible level. The phase map 508 is smooth compared to the phase map 506. During data acquisition, the systems 400 and methods 450 include a reference scan, scan time of which is in the order of milliseconds or seconds. That is, in reducing ghost artifacts to an indiscernible level, the associated penalty of increase in scan time of the systems and methods disclosed herein is negligible.

Figure 6:
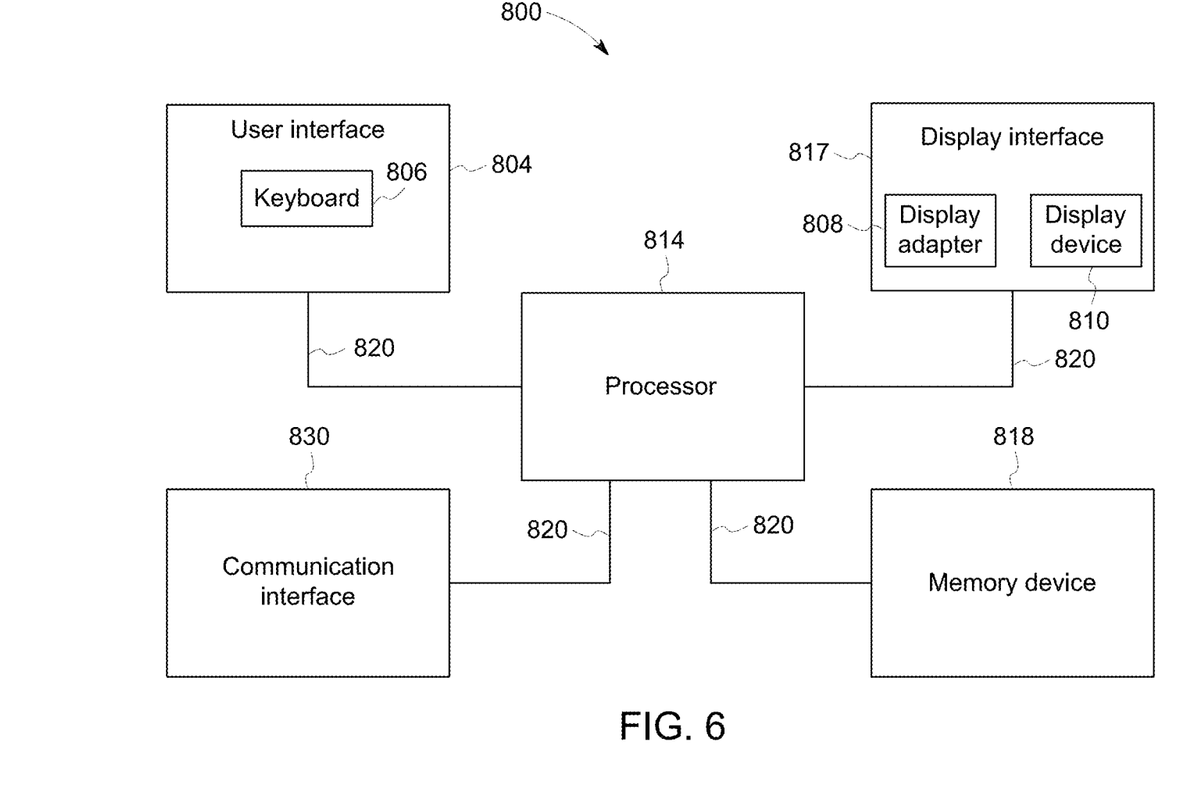
FIG. 6 is a block diagram of an exemplary computing device.

The workstation 12 and the phase correction computing device 402 described herein may be any suitable computing device 800 and software implemented therein. FIG. 6 is a block diagram of an exemplary computing device 800. In the exemplary embodiment, the computing device 800 includes a user interface 804 that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a display interface 817 that presents information, such as input events and/or validation results, to the user. The display interface 817 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the display interface 817 may include an audio output device (e.g., an audio adapter and/or a speaker) and/or a printer.

The computing device 800 also includes a processor 814 and a memory device 818. The processor 814 is coupled to the user interface 804, the display interface 817, and the memory device 818 via a system bus 820. In the exemplary embodiment, the processor 814 communicates with the user, such as by prompting the user via the display interface 817 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

At least one technical effect of the systems and methods described herein includes (a) reduction of high order phase error; (b) reduction of ghost artifacts with negligible increase of scan time.

Exemplary embodiments of systems and methods of phase correction are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A magnetic resonance (MR) imaging method of correcting phase errors in a precorrection MR image of a subject, comprising:
    applying, by an MR system, a pulse sequence to acquire the precorrection MR image;
    acquiring, by the MR system, reference k-space data of the subject having a field of view (FOV) in a phase-encoding direction that is twice or more greater than an FOV of the precorrection MR image in the phase-encoding direction, wherein the reference k-space data and MR signals of the precorrection MR image are acquired with the same type of pulse sequences;
    splitting the reference k-space data into first k-space data and second k-space data;
    generating a phase error map based on the first k-space data and the second k-space data;
    generating a phase-corrected image of the precorrection MR image based on the phase error map; and
    outputting the phase-corrected image.

2. The method of claim 1, wherein splitting the reference k-space data further comprises:
    splitting the reference k-space data into odd echo k-space data and even echo k-space data.

3. The method of claim 2, wherein splitting the reference k-space data further comprises:

matching a k-space location of the odd echo k-space data in the phase-encoding direction with a k-space location of the even echo k-space data in the phase-encoding direction.

4. The method of claim 1, wherein acquiring reference k-space data further comprises receiving the reference k-space data and the precorrection MR image acquired with an echo-planar imaging (EPI) pulse sequence.

5. The method of claim 1, wherein generating a phase error map further comprises:
computing the phase error map as a phase difference map between phases of the first k-space data and phases of the second k-space data; and
computing the phase error map by fitting the phase difference map with a two-dimensional (2D) polynomial function in a kx direction and in a ky direction, wherein the polynomial function has a degree of two or higher.

6. The method of claim 5, wherein the polynomial function has a degree of five.

7. The method of claim 1, wherein generating a phase error map further comprises generating a linear phase error map based on the generated phase error map; and the method further comprising:
adjusting phase-encoding gradients based on the linear phase error map; and
acquiring the precorrection MR image with a pulse sequence having the adjusted phase-encoding gradients.

8. The method of claim 7, wherein:
generating a phase error map further comprises adjusting the generated phase error map by subtracting the linear phase error map from the generated phase error map; and
generating a phase-corrected image further comprises correcting phases of the precorrection MR image using the adjusted phase error map.

9. The method of claim 1, wherein the precorrection MR image is acquired by a plurality of radio frequency (RF) coils, and generating a phase-corrected image further comprises:
doubling an acceleration factor using odd echo data of the precorrection MR image acquired by one of the plurality of RF coils and even echo data of the precorrection MR image acquired by the RF coil.

10. The method of claim 9, wherein doubling an acceleration factor comprises:
splitting MR signals of the precorrection MR image into the odd echo data and the even echo data;
generating a combined image based on the odd echo data and the even echo data;
generating a coil sensitivity map of the coil;
generating a replicated coil sensitivity map based on the coil sensitivity map and the generated phase error map;
combining the coil sensitivity map and the replicated coil sensitivity map into a combined coil sensitivity map; and
generating the phase-corrected image based on the combined image and the combined coil sensitivity map.

11. A phase correction system of correcting phase errors in a precorrection magnetic resonance (MR) image of a subject, comprising a phase correction computing device, the phase correction computing device comprising at least one processor in communication with at least one memory device, and the at least one processor programmed to:
instruct, an MR system, to apply a pulse sequence that acquires reference k-space data of the subject having a field of view (FOV) in a phase-encoding direction that is twice or more greater than an FOV of the precorrection MR image in the phase-encoding direction, wherein the reference k-space data and MR signals of the precorrection MR image are acquired with the same type of pulse sequences;
split the reference k-space data into first k-space data and second k-space data;
generate a phase error map based on the first k-space data and the second k-space data;
correcting phase errors in the precorrection MR image based on the phase error map; and
output the phase-corrected image.

12. The system of claim 11, wherein the at least one processor is further programmed to:
split the reference k-space data into odd echo k-space data and even echo k-space data.

13. The system of claim 12, wherein the at least one processor is further programmed to:
match a k-space location of the odd echo k-space data in the phase-encoding direction with a k-space location of the even echo k-space data in the phase-encoding direction.

14. The system of claim 11, wherein the at least one processor is further programmed to:
receive the reference k-space data and the precorrection MR image acquired with an echo-planar imaging (EPI) pulse sequence.

15. The system of claim 11, wherein the at least one processor is further programmed to:
compute the phase error map as a phase difference map between phases of the first k-space data and phases of the second k-space data; and
compute the phase error map by fitting the phase difference map with a two-dimensional (2D) polynomial function in a kx direction and in a ky direction, wherein the polynomial function has a degree of two or higher.

16. The system of claim 15, wherein the polynomial function has a degree of five.

17. The system of claim 11, wherein the at least one processor is further programmed to:
generate a linear phase error map based on the generated phase error map;
adjust phase-encoding gradients based on the linear phase error map; and
instruct the MR system to acquire the precorrection MR image with a pulse sequence having the adjusted phase-encoding gradients.

18. The system of claim 17, wherein the at least one processor is further programmed to:
adjust the generated phase error map by subtracting the linear phase error map from the generated phase error map; and
correct phases of the precorrection MR image using the adjusted phase error map.

19. The system of claim 11, wherein the precorrection MR image is acquired by a plurality of radio frequency (RF) coils, and the at least one processor is further programmed to:
double an acceleration factor using odd echo data of the precorrection MR image acquired by one of the plurality of RF coils and even echo data of the precorrection MR image acquired by the RF coil.

20. The system of claim 19, wherein the at least one processor is further programmed to:
split MR signals of the precorrection MR image into the odd echo data and the even echo data;

generate a combined image based on the odd echo data and the even echo data;
generate a coil sensitivity map of the coil;
generate a replicated coil sensitivity map based on the coil sensitivity map and the generated phase error map;
combine the coil sensitivity map and the replicated coil sensitivity map into a combined coil sensitivity map; and
generate the phase-corrected image based on the combined image and the combined coil sensitivity map.

* * * * *